United States Patent [19]

Tsukahara

[11] Patent Number: 5,543,752
[45] Date of Patent: Aug. 6, 1996

[54] MICROWAVE AMPLIFIER CIRCUIT HAVING REDUCED HARMONIC DISTORTION

[75] Inventor: Yoshihiro Tsukahara, Itmai, Japan

[73] Assignee: Mitsubishi Denki Kabushiki Kaisha, Tokyo, Japan

[21] Appl. No.: 433,753

[22] Filed: May 4, 1995

[30] Foreign Application Priority Data

Jul. 26, 1994 [JP] Japan .................................. 6-174194

[51] Int. Cl.$^6$ .................................. H03F 3/68; H03F 1/26
[52] U.S. Cl. .................................. 330/124 R; 330/149
[58] Field of Search .................................. 330/107, 124 R, 330/126, 286, 295, 53, 149; 333/138, 139, 156

[56] References Cited

U.S. PATENT DOCUMENTS

| | | | |
|---|---|---|---|
| 4,532,478 | 7/1985 | Silagi | 330/151 |
| 5,019,793 | 5/1991 | McNab | 333/139 X |
| 5,101,171 | 3/1992 | Redmond | 330/124 R |
| 5,311,155 | 5/1994 | Blodgett | 333/28 R |
| 5,317,288 | 5/1994 | Yung et al. | 333/139 X |

FOREIGN PATENT DOCUMENTS

| | | |
|---|---|---|
| 4120029 | 12/1992 | Germany . |
| 2239756 | 7/1991 | United Kingdom . |

OTHER PUBLICATIONS

Chambers, "Unity–Gain Frequency–Independent Precision Phase–Shifter", Electronics Letters, vol. 20, No. 4, 1984, pp. 151–152.

*Primary Examiner*—Steven Mottola
*Attorney, Agent, or Firm*—Leydig, Voit & Mayer

[57] ABSTRACT

A microwave amplifier circuit includes a divider having an input connected to an input terminal of the amplifier circuit, dividing an input signal applied to the input terminal into two divided signals, and outputting the divided signals to first and second output ends outputs, respectively. First and second microwave amplifiers having inputs respectively connected to the first and second outputs of the divider. A combiner mixer having first and second inputs and an output as the first input connected to the output of the first microwave amplifier through a 90° phase shifter, the second input connected to the output of the second microwave amplifier, and the output connected to the output terminal of the microwave amplifier circuit. Therefore, the doublet component of the output signal can be suppressed by combining the amplified signal which has shifted the phase of the doublet component by 180° the amplified signal having the same phase as the input signal. As a result, in the microwave amplifier circuit, the passing phase of the signal passing through the amplifier circuit does not vary, gain at outside the band, i.e., gain in the high frequency region, is suppressed and the IM3 frequency component is suppressed.

6 Claims, 8 Drawing Sheets

MICROWAVE AMPLIFIER CIRCUIT HAVING REDUCED HARMONIC DISTORTION

FIELD OF THE INVENTION

The present invention relates to a microwave amplifier circuit that cancels a distorted harmonic component of an amplified signal.

BACKGROUND OF THE INVENTION

Figure 11:
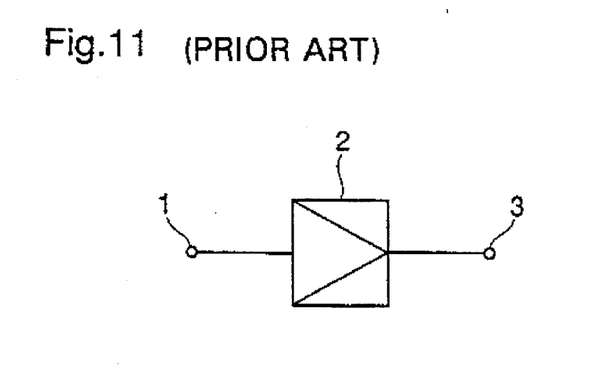
FIG. 11 is a diagram illustrating a prior art microwave amplifier circuit.

FIG. 11 shows a prior art microwave amplifier circuit. In the figure, reference numeral 1 designates an input terminal, numeral 2 designates a microwave amplifier, and numeral 3 designates an output terminal.

A description is given of the operation. An input signal applied to the input terminal 1 is amplified by the microwave amplifier 2, and the amplified output signal is output to the output terminal 3. Such a microwave amplifier circuit has characteristics such that when the level of the input signal increases, the amplified output signal becomes saturated at a prescribed level.

Figure 12:
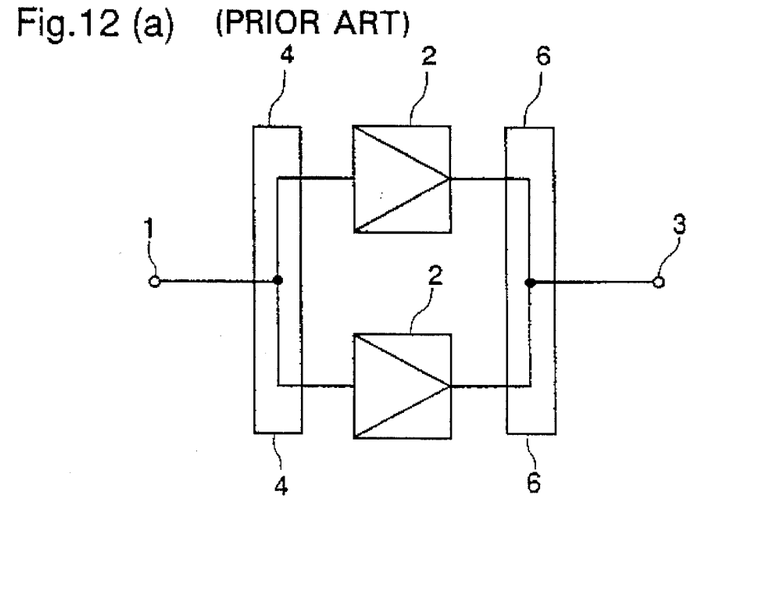
FIGS. 12(a) and 12(b) are a diagram illustrating a prior art microwave amplifier circuit and a diagram illustrating the characteristics of the input-output levels of the circuit, respectively.

FIG. 12(a) shows a circuit of a dividing and combining type amplifier including two such microwave amplifier circuits and FIG. 12(b) shows results of simulation of the input and output levels of this circuit. In figure 12(a), reference numerals 1, 2, and 3 designate the same elements as in FIG. 11. Reference numeral 4 designates a divider which divides the input signal into two and numeral 6 designates a combiner for combining the output signals from the two microwave amplifiers 2.

A description is given of the operation. An input signal applied to the input terminal 1 is divided by the divider 4 into two, these two signals are amplified by the two microwave amplifiers 2, respectively, and the two amplified output signals are combined by the combiner 6 and its output is output from the output terminal 3.

In this dividing and combining type amplifier, when the input level increases exceeding some value, for example, about −22.0 dBm, and the output signal begins to be saturated, i.e., the output Pout becomes almost 0.0 dBm, the output levels of the doublet component $2f_0$ and the triplet component $3f_0$ become high relative to the fundamental wave component $f_0$. When the output levels of the doublet component $2f_0$ and the triplet component $3f_0$ are high, the output distortion becomes large.

Such a microwave amplifier is used in a mobile communication system such as a portable telephone. In accordance with a rapid spread of recent mobile communication systems, such a microwave amplifier has been required to provide an output having low distortion.

In the prior art microwave amplifier described above, however, when the output signal is saturated because of an increase in the output level, the output level of the harmonic wave component increases, thereby resulting in large distortion in the output.

In addition, when the doublet component and the triplet component increase with the saturation of the output signal as described above, there occur phase variations which are caused by the passage of the signal through the amplifier.

Furthermore, when there are a lot of harmonic wave components in the amplified signal and the frequency signals having center frequencies of f1 and f2 quite close to each other are mixed, an output called third intermediate wave (hereinafter, referred to as IM3) is generated and has a frequency represented by 2×f1–f2 or 2×f2–f1.

SUMMARY OF THE INVENTION

It is an object of the present invention to provide a microwave amplifier circuit that cancels harmonic wave components which are increased due to amplifier saturation and that does not cause passing phase variations while the signals pass through the amplifier.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a microwave amplifier circuit comprises a divider having an input end connected to an input terminal of the amplifier circuit, which divides an input signal applied to the input end into two, and outputs the divided signals into first and second output ends, respectively, first and second microwave amplifiers having input ends being respectively connected to the first and second output ends of the divider, a combiner having first and second input ends and an output end, in which the first input end is connected to the output end of the first microwave amplifier through a 90° phase shifter, the second input end is connected to the output end of the second microwave amplifier, and the output end is connected to an output terminal of the microwave amplifier circuit. Therefore, the doublet component of the output signal can be suppressed by combining the amplified signal which has shifted the phase of the doublet component by 180° and the amplified signal having the same phase as the input signal. As a result, in the microwave amplifier circuit, the passing phase of the signal passing through the amplifier does not vary, the gain outside of the band, i.e., the gain at the high frequency region, is suppressed, and the above-described IM3 is suppressed.

According to a second aspect of the present invention, a microwave amplifier circuit comprises a microwave amplifier having an input end connected to an input terminal of the amplifier circuit, a divider having an input end connected to an output end of the microwave amplifier and first and second output ends, a combiner having first and second input ends and an output end, in which the first input end is connected to the first output end of the divider through a 90° phase shifter, the second input end is directly connected to the second output end of the divider, and the output terminal is connected to an output terminal of the microwave amplifier circuit. Therefore, the doublet component of the output signal can be suppressed by combining the amplified signal which has shifted the phase of the doublet component by 180° and the amplified signal having the same phase as the input signal. As a result, in the microwave amplifier circuit, the passing phase of the signal passing through the amplifier does not vary, the gain outside the band, i.e., the gain at the high frequency region, is suppressed, and the above-described IM3 is suppressed.

According to a third aspect of the present invention, a microwave amplifier circuit comprises a divider having an input end connected to an input terminal of the amplifier circuit, which divides an input signal applied to the input end into three, and outputs the divided signals to first, second, and third output ends, respectively, first, second, and third microwave amplifiers having input ends being respectively connected to the first, second, and third output ends of the divider, a combiner having first, second, and third input ends and an output end, in which the first input end is connected to an output end of the first microwave amplifier through a −60° phase shifter, the second input end is directly connected to an output end of the second microwave amplifier, the third input end is connected to an output end of the third microwave amplifier through a +60° phase shifter, and the output end is connected to an output terminal of the microwave amplifier circuit. Therefore, the doublet component of the output signal can be suppressed by combining the amplified signal that has shifted the phase of the doublet component by +120°, the amplified signal that has shifted the phase of the doublet component by −120°, and the amplified signal having the same phase as input signal. As a result, in the microwave amplifier circuit, the passing phase of the signal passing through the amplifier does not vary, the gain outside the band, i.e., the gain at the high frequency region, is suppressed, and the IM3 harmonic is suppressed.

According to a fourth aspect of the present invention, a microwave amplifier circuit comprises a microwave amplifier having an input end connected to an input terminal of the microwave amplifier circuit, a divider having an input end connected to an output end of the microwave amplifier, and first, second, and third output ends, a combiner having first, second, and third input ends and an output end, in which the first input end is connected to the first output end of the divider through a −60° phase shifter, the second input end is directly connected to the second output end of the divider, the third input end is connected to the third output end of the divider through a +60° phase shifter, and the output end is connected to an output terminal of the microwave amplifier circuit. Therefore, the doublet component of the output signal can be suppressed by combining the amplified signal that has shifted the phase of the doublet component by +120°, the amplified signal that has shifted the phase of the doublet component by −120°, and the amplified signal having the same phase as input signal. As a result, in the microwave amplifier circuit, the passing phase of the signal passing through the amplifier does not vary, the gain outside the band, i.e., the gain at the high frequency region, is suppressed, and the IM3 harmonic is suppressed.

According to a fifth aspect of the present invention, a microwave amplifier circuit comprises a divider having an input end connected to an input terminal of the amplifier circuit and first and second output ends, which divides an input signal applied to the input end into two, and outputs the divided signals to the first and second output ends respectively, first and second microwave amplifiers having input ends being respectively connected to the first and second output ends of the divider, a combiner having first and second input ends and an output end, in which the first input end is connected to an output end of the microwave amplifier through two 90° phase shifters connected in series, the second input end is directly connected to an output end of the second microwave amplifier, and the output end is connected to an output terminal of the microwave amplifier circuit. Therefore, the fundamental wave components cancel each other and only the doublet component is taken out by combining the amplified signals that has shifted the phase of the fundamental wave component by 180° and has shifted the phase of the doublet component by 360°, i.e., having the same phase for the doublet component, and the amplified signal having the same phase as the input signal, thereby obtaining a microwave amplifier circuit which is utilized as a multiplier.

According to a sixth aspect of the present invention, a microwave amplifier circuit comprises a microwave amplifier having an input end being connected to an input terminal of the microwave amplifier circuit, a divider having an input end connected to an output end of the microwave amplifier, and first and second output ends, a combiner having first and second input ends and an output end, in which the first input end is connected to the first output end of the divider through two 90° phase shifters connected in series, the second input end is directly connected to the second output end of the divider, and the output end is connected to an output terminal of the microwave amplifier circuit. Therefore, the fundamental wave components are canceled with each other and only the doublet component is taken out by combining the amplified signal that has shifted the phase of the fundamental wave component by 180° and has the same phase for the doublet component, the amplified signal having the same phase as input signal, thereby obtaining a microwave amplifier circuit which is utilized as a multiplier.

DETAILED DESCRIPTION OF THE PREFERRED EMBODIMENTS

Embodiment 1

Figure 1:
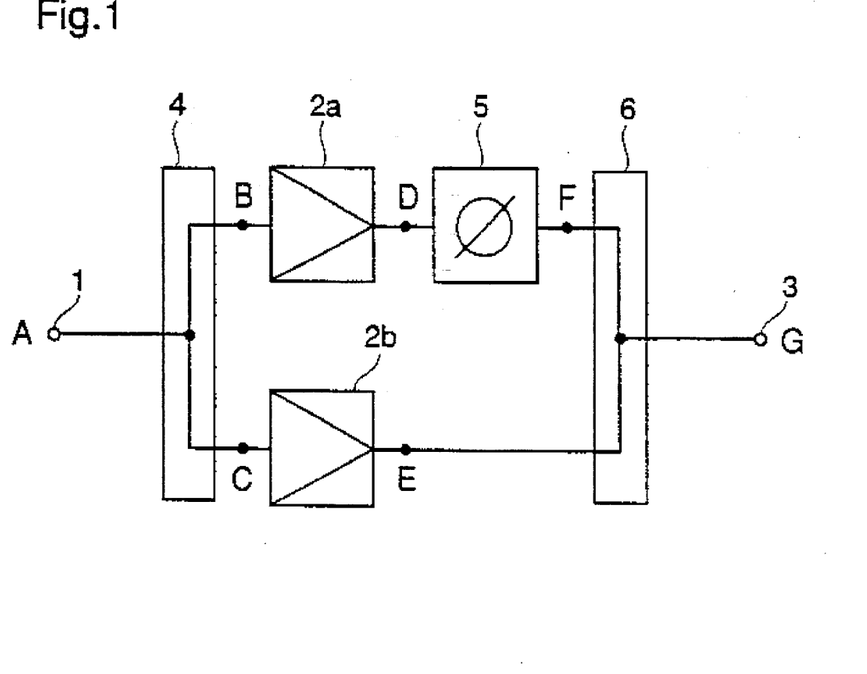
FIG. 1 is a diagram illustrating a circuit of a microwave amplifier circuit according to a first embodiment of the present invention.
Figure 2:
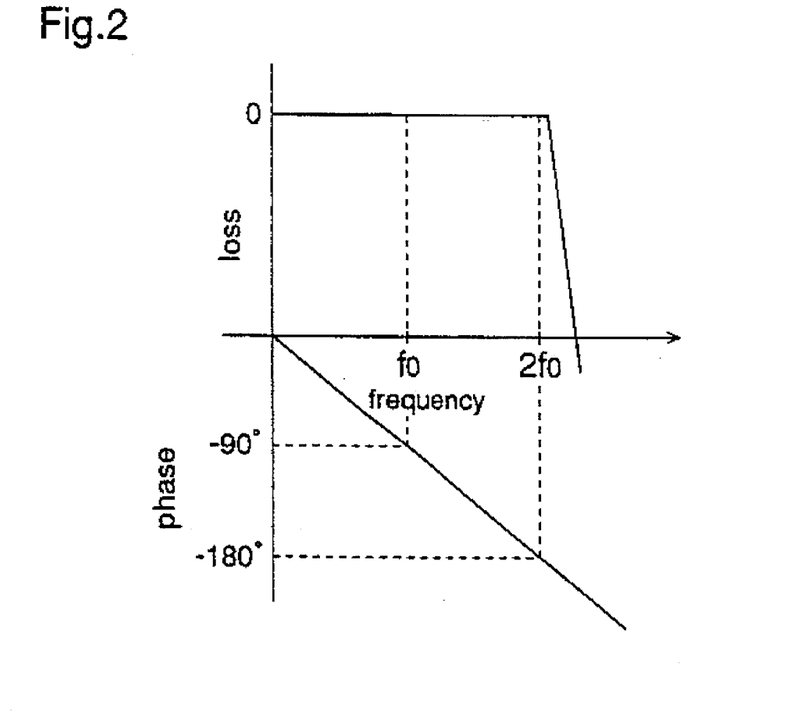
FIG. 2 is a diagram illustrating transmission characteristics of a 90° phase shifter.

FIG. 1 is a diagram showing a construction of a microwave amplifier circuit according to a first embodiment of the present invention. In the figure, reference numeral 1 designates an input terminal, and numerals 2a and 2b designate first and second microwave amplifiers, respectively. Reference numeral 3 designates an output terminal and numeral 4 designates a two direction divider which divides an input signal from the input terminal 1 into two and supplies those to the first and second amplifiers 2a and 2b, respectively. Reference numeral 5 designates a 90° phase shifter which shifts the phase of the output signal of the first microwave amplifier 2a by 90°, having a frequency response characteristic as shown in FIG. 2. Reference numeral 6 designates a two channel combiner for combining the output of the 90° phase shifter 5 and the output of the second microwave amplifier 2b.

A description is given of the operation. An input signal applied to the input terminal 1 is divided into two signals each having a power of half of the input signal by the divider 4, and output to points B and C, respectively. The signals that are output to the points B and C are respectively amplified by the first and second microwave amplifiers 2a and 2b and output to the points D and E, respectively. When the input signals applied to the respective amplifiers 2a and 2b are large, the output level becomes non-linear relative to the input level and the output signal includes distortion depending on the characteristics of the amplifiers. The signal that is output to the point D is input to the mixer 6 through the 90° phase shifter 5, while the signal that is output to the point E is input to the mixer 6 as it is. With respect to the frequency characteristic of the phase shifter 5, the phase of the fundamental wave component $f_0$ is shifted by $-90°$ and the phase for the doublet component $2f_0$ is shifted by $-180°$. With respect to the transmission characteristic, the phase shifter 5 functions as a low-pass filter that passes an input signal having a frequency up to $2f_0$ as shown in FIG. 2. The signal that has passed through the 90° phase shifter 5 is shifted in its phase by the above-described characteristics, and frequencies higher than the doublet component are blocked by the low pass filter characteristics of the phase shifter from being output. Further, the signal at the point F having passed through the 90° phase shifter 5 and the signal at the point E which does not pass through the 90° phase shifter after being amplified by the microwave amplifier 2b are combined by the two channel combiner 6 and output to the output terminal 3.

Figure 3:
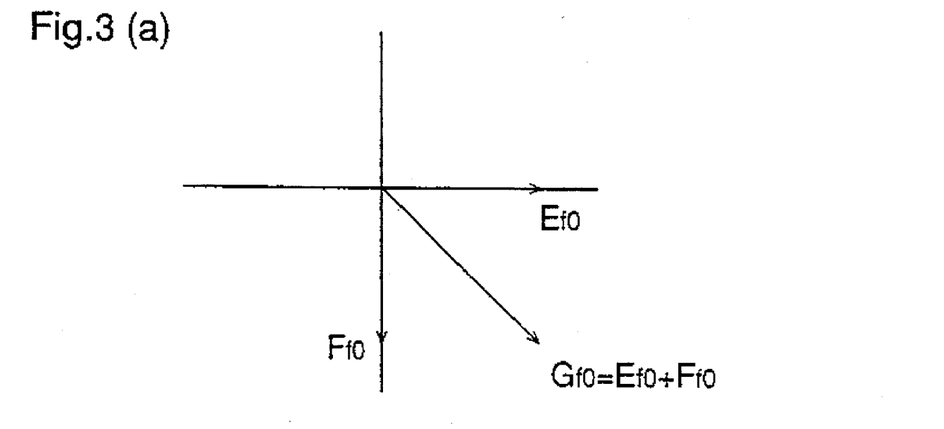
FIGS. 3(a), 3(b) and 3(c) are vector diagrams illustrating the principle of the microwave amplifier circuit of the first embodiment.

FIGS. 3(a), 3(b), and 3(c) are vector diagrams of the fundamental wave component $f_0$, the doublet component $2f_0$, and the triplet component $3f_0$ at the points E, F, and G, respectively. In FIG. 3(b), the doublet component $E2f_0$ generated from the microwave amplifier 2b and the doublet component $F2f_0$ generated from the microwave amplifier 2a and phase shifted by passing through the phase shifter 5 are combined by the combined 6 and mutually canceled.

Figure 4:
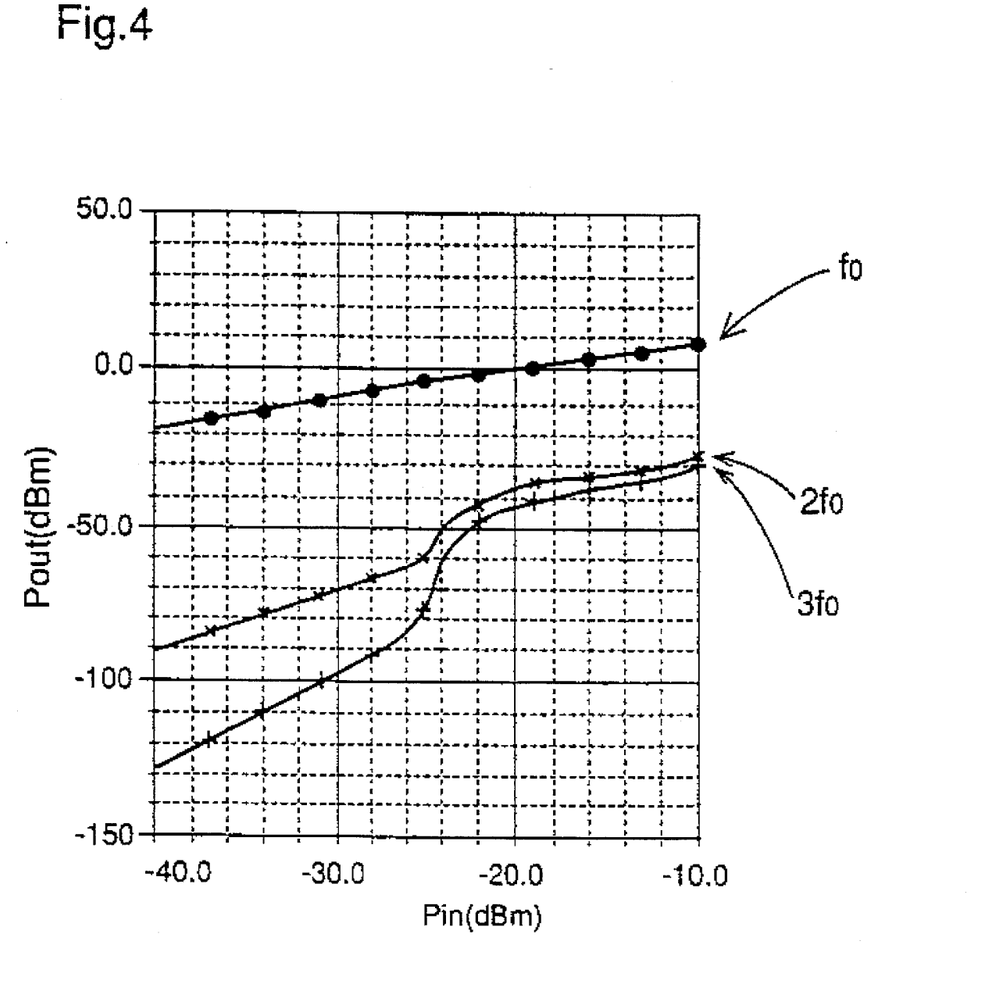
FIG. 4 is a diagram illustrating characteristics of input-output levels of a microwave amplifier circuit of the first embodiment.

FIG. 4 shows simulation results of the input and output signal levels in the circuit of the first embodiment. As compared with simulation results of the input and output signal levels in the prior art amplifier circuit shown in FIG. 12(b), it is found that the increase in the doublet component is suppressed.

In the microwave amplifier circuit of this first embodiment, by combining the signal that is amplified by the first microwave amplifier and phase shifted by 180° for the doublet component by the phase shifter and the signal that is amplified by the second microwave amplifier, the doublet component that increases due to saturation of the amplified signal can be removed. In addition, the third intermediate wave (hereinafter, referred to as IM3) can be removed and an amplified signal that is closer to the fundamental wave component can be obtained.

Embodiment 2

Figure 5:
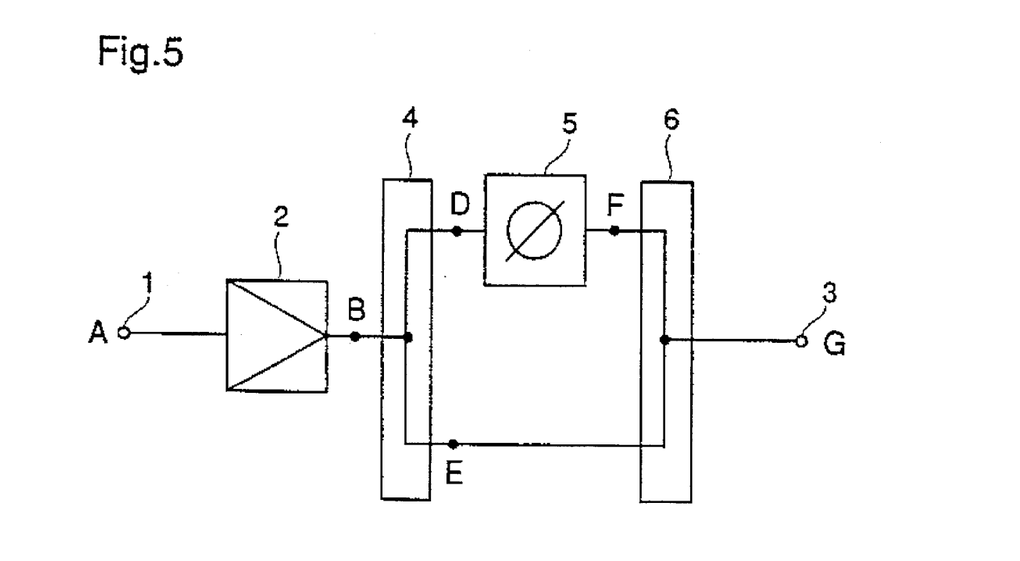
FIG. 5 is a diagram illustrating a circuit of a microwave amplifier circuit according to a second embodiment of the present invention.

FIG. 5 shows a construction of a microwave amplifier circuit according to a second embodiment of the present invention. In FIG. 5, the same reference numerals as in FIGS. 1 and 11 designate the same or corresponding parts. Reference numeral 1 designates an input terminal, numeral 2 designates a microwave amplifier, numeral 3 designates an output terminal, numeral 4 designates a two direction divider, and numeral 6 designates a two channel combiner.

A description is given of the operation. As in the first embodiment the input signal is divided by the divider 4. Then, in the first embodiment the respective signals are amplified by the microwave amplifiers 2a and 2b. In this second embodiment an input signal is amplified by one microwave amplifier 2, and then the amplified signal is divided by the two direction divider 4 and the signal that has passed through the 90° phase shifter 5 and the signal which does not pass through the 90° phase shifter 5 are combined by the two channel combiner 6 and output to the output terminal 3. Also in this case, when the signal applied to the microwave amplifier 2 is large then, output level becomes non-linear relative to the input level and output signal would include distortion depending on the characteristics of the amplifier, and the output is divided and output to the points D and E shown in FIG. 5 by the divider 4. The points D and E correspond to those shown in FIG. 1, and the operation is the same as the first embodiment. The signal that is output to the point D is input to the combiner 6 through the 90° phase shifter 5, while the signal that is output to the point E is input to the combiner 6 as it is, and then both signals are combined by the combiner 6 and mutually canceled.

In the microwave amplifier circuit of this second embodiment, by combining the signal that is amplified and the signal that is amplified and phase shifted by 180° for the doublet component by the phase shifter, as in the first embodiment, the doublet component that increases due to saturation of the amplified signal can be removed by one amplifier. In addition, the IM3 can be removed and an amplified signal that is closer to the fundamental wave component can be obtained.

Embodiment 3

Figure 6:
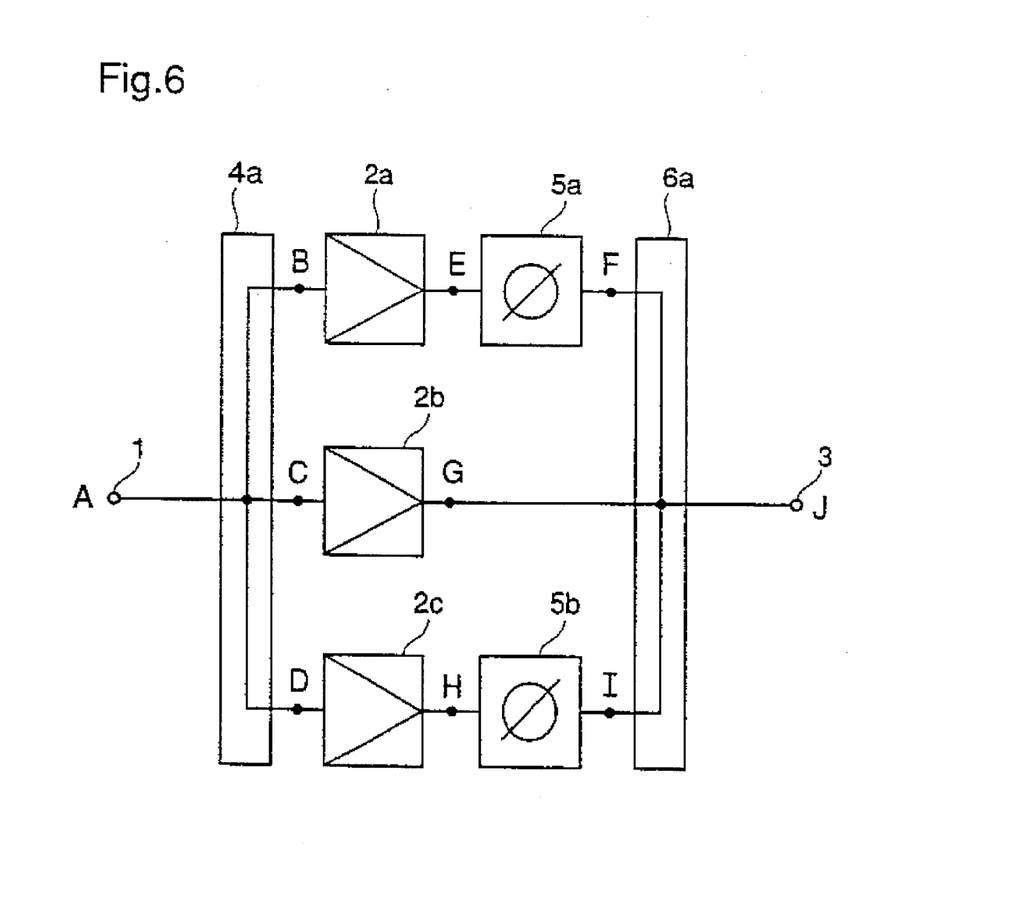
FIG. 6 is a diagram illustrating a circuit of a microwave amplifier circuit according to third embodiment of the present invention, FIGS. 7(a), 7(b); and 7(c) are vector diagrams illustrating the operation principle of the microwave amplifier circuit of the third embodiment.

FIG. 6 is a diagram showing a construction of a microwave amplifier circuit according to a third embodiment of the present invention. In the figure, the same reference numerals as in FIG. 1 designate the same or corresponding parts. Reference numerals 2a, 2b, and 2c designate first, second, and third microwave amplifiers, respectively. Reference numeral 4a designates a three direction divider, numeral 5a designates a $-60°$ phase shifter, numeral 5b designates a $+60°$ phase shifter, and numeral 6a designates a three channel combiner.

A description is given of the operation. An input signal applied to the input terminal 1 is divided into three signals each having a power of ⅓ of the input signal by the three direction divider 4a, and output to points B, C, and D in FIG. 6. The points B, C, and D are respectively connected to the microwave amplifiers 2a, 2b, and 2c, and the amplified signals are output to the points E, G, and H, respectively. When the signals applied to the respective amplifiers are large, as in the above-described embodiments, the output signals are distorted depending on the characteristics of the amplifiers. The amplified signals are output to the points E, G, and H, respectively, in which the signal that is output to the point G is input to the three channel combiner 6a as it is, and the signals that are output to the points E and H pass through the phase shifters 5a and 5b, respectively, and are input to the three channel combiner 6a. With respect to the frequency characteristic of the phase shifter 5a, the phase of the fundamental wave component $f_0$ is shifted by $-60°$ and the phase of the doublet component $2f_0$ is shifted by $-120°$. With respect to the transmission characteristic, the phase shifter 5a functions as a low-pass filter that passes an input signal having a frequency up to $2f_0$. With respect to the frequency characteristic of the phase shifter 5b, the phase of the fundamental wave component $f_0$ is shifted by $+60°$ and the phase of the doublet component $2f_0$ is shifted by $+120°$. With respect to the passing characteristic, the phase shifter 5b functions as a low-pass filter that passes an input signal having a frequency up to $2f_0$.

Figure 7:
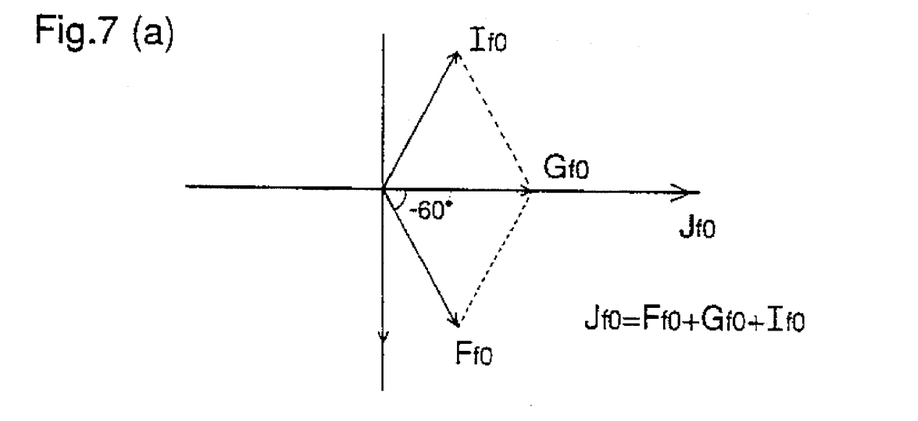

The signal from the point E passes through the phase shifter 5a and is input to the combiner 6a from the point F, and the signal from the point H passes through the phase shifter 5b and is input to the combiner 6a from the point I. The signals having passed through the phase shifters 5a and 5b are phase shifted according to the above-described characteristics, and the signals having higher frequencies than the doublet component are blocked by the low pass filter from being output. The signal at point F having passed through the phase shifter 5a, the signal at point I having passed through the phase shifter 5b, and the signal at point G which does not pass through the phase shifter, after being amplified, are combined by the combiner 6 and output to the output terminal 3. FIGS. 7(a), 7(b), and 7(c) are vector diagrams showing a fundamental wave component $f_0$, a doublet component $2f_0$, and a triplet component $3f_0$ at the points F, G, and I, respectively. In FIG. 7(b), three signals of a doublet component $G2f_0$ generated from the amplifier 2b and doublet components $F2f_0$ and $I2f_0$ generated from the amplifiers and having passed through the phase shifters are combined by the combiner 6a and mutually canceled.

In the microwave amplifier circuit of this third embodiment, by combining the signal that is amplified and the two signals that are amplified and phase shifted by 120° in both plus and minus directions for the phase of the doublet component by the phase shifters, the doublet component that increases due to saturation of the amplified signal can be removed. In addition, the IM3 can be removed and an amplified signal that is closer to the fundamental wave component can be obtained.

Embodiment 4

Figure 8:
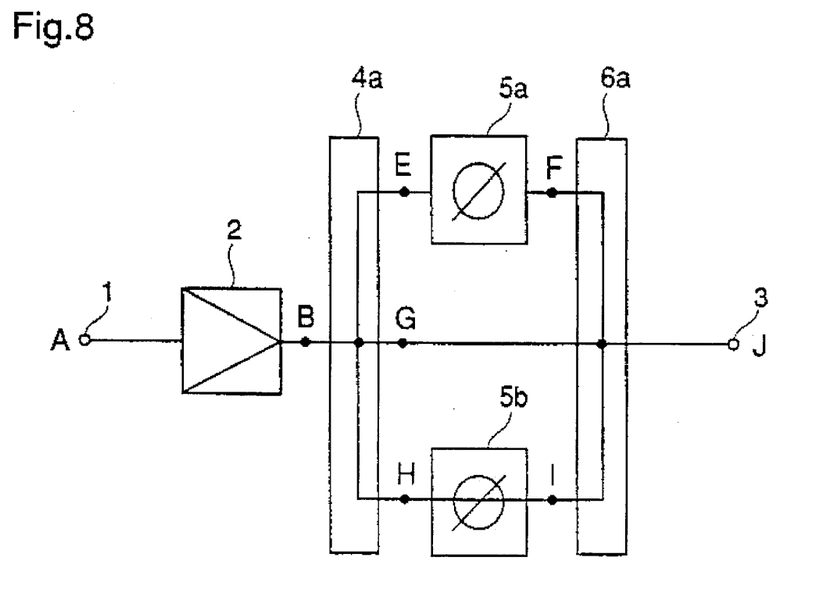
FIG. 8 is a diagram illustrating a circuit of a microwave amplifier circuit according to a fourth embodiment of the present invention.

FIG. 8 is a diagram showing a construction of a microwave amplifier circuit according to a fourth embodiment of the present invention. In the figure, the same reference numerals as in FIGS. 5 and 6 designate the same or corresponding parts. Reference numeral 1 designates an input terminal, numeral 2 designates a microwave amplifier, numeral 3 designates an output terminal, numeral 4a designates a three direction divider, numeral 5a designates a $-60°$ phase shifter, numeral 5b designates a $+60°$ phase shifter, and numeral 6a designates a three channel combiner.

A description is given of the operation. As in the third embodiment the input signal applied to the input terminal 1 is divided by the three direction divider 4a and amplified by the microwave amplifiers 2a, 2b, and 2c. In this fourth embodiment an input signal is amplified by one microwave amplifier 2 and divided by the three direction divider 4a. Also in this case, when the signal applied to the microwave amplifier 2 is large, the output level becomes relative to the input level and the output signal would include distortion depending on the characteristics of the amplifier, and then the signal is output to the points E, G, and H by the three direction divider 4a. As in the third embodiment, the signals are output to the points E, G, and H. The signal that is output to the point G is input to the three channel combiner 6a as it is, and the signals that are output to the points E and H are phase shifted by the $-60°$ phase shifter 5a and $+60°$ phase shifter 5b and input to the three channel combiner 6a.

The signal from the point E is phase shifted by the $-60°$ phase shifter 5a and input to the three channel combiner 6a from the point F and the signal from the point H is phase shifted by the $+60°$ phase shifter 5b and input to the three channel combiner 6a from the point I. The fundamental wave component of these signals is phase shifted by the characteristics of the phase shifters 5a and 5b, and a signal having higher frequencies than the doublet component is blocked by the low pass filter characteristics from being output. The signals from the points F and I having passed through the phase shifters 5a and 5b and the signal from the point G that does not pass through the phase shifter after being amplified are combined by the three channel combiner 6 and output to the output terminal 3. The vector diagrams showing the fundamental wave component $f_0$, the doublet component $2f_0$, and triplet component $3f_0$ are the same as those shown in FIGS. 7(a), 7(b), and 7(c) of the third embodiment, respectively. In FIG. 7(b), three signals of the doublet component $G2f_0$ generated from the amplifier, doublet components $F2f_0$ and $I2f_0$ generated from the amplifiers and having passed through the phase shifters 5a and 5b are combined by the three channel combiner 6a and mutually canceled.

In the microwave amplifier circuit of this fourth embodiment, by combining the signal that is amplified as it is and the two signals that are amplified and phase shifted by 120° in both plus and minus directions for the phase of the doublet component by the phase shifters, in the third embodiment, the doublet component that increases due to saturation of the amplified signal can be removed using only one amplifier. In addition, the IM3 can be removed and an amplified signal that is closer to the fundamental wave component can be obtained.

Embodiment 5

Figure 9:
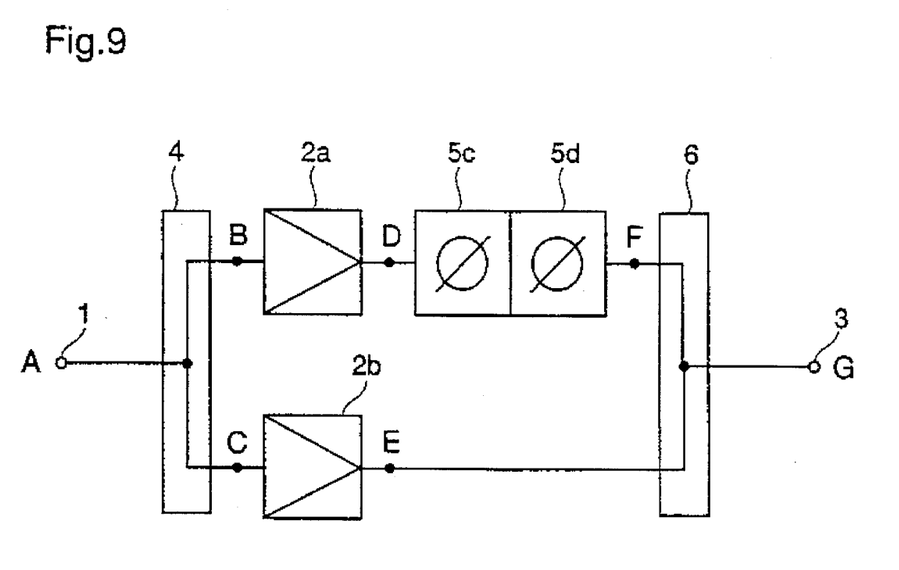
FIG. 9 is a diagram illustrating a circuit of a microwave amplifier circuit according to a fifth embodiment of the present invention.

FIG. 9 is a diagram showing a construction of a microwave amplifier circuit according to a fifth embodiment of the present invention. In this circuit, another 90° phase shifter is connected at a rear stage of the first a phase shifter of the embodiment shown in FIG. 1 so as to output only doublet component. In FIG. 9, the same reference numerals as in FIG. 1 designate the same or corresponding parts. Reference numerals 5c and 5d designate first and second 90° phase shifters.

A description is given of the operation. In FIG. 9, an input signal applied to the input terminal 1 is divided into two signals each having a power of half of the input signal by the divider 4, and output to points B and C, respectively. The signals from the points B and C are respectively amplified by the first and second microwave amplifiers 2a and 2b and output to the points D and E. When the signals applied to the respective amplifiers are large then the signal is distorted depending on the characteristics of the amplifiers as described above. The signal that is output to the point D is input to the combiner 6 through the 90° phase shifters 5c and 5d, while the signal that is output to the point E is input to the combiner 6 as it is. As a result, an output signal including the doublet component, generated by the amplification is shifted in its phase for the fundamental wave by 180° (=90°+90°) and for the doublet by 360° (=180°+180°) by the phase shifters 5c and 5d and input to the combiner 6 from the point F. In the combiner, the signal from the point F and the signal from the point E are combined, and the fundamental wave components having phases shifted by 180° are mutually canceled and the doublet component having phase shifted by 360°, that is, having the same phase, is intensified and output to the output terminal 3.

In the microwave amplifier circuit of this fifth embodiment, by combining the signal that has passed through two 90° phase shifters connected in series and the signal that does not pass through the phase shifters, the doublet component that increases due to saturation of the amplified signal can be output to obtain the circuit functioning as a multiplier.

Embodiment 6

Figure 10:
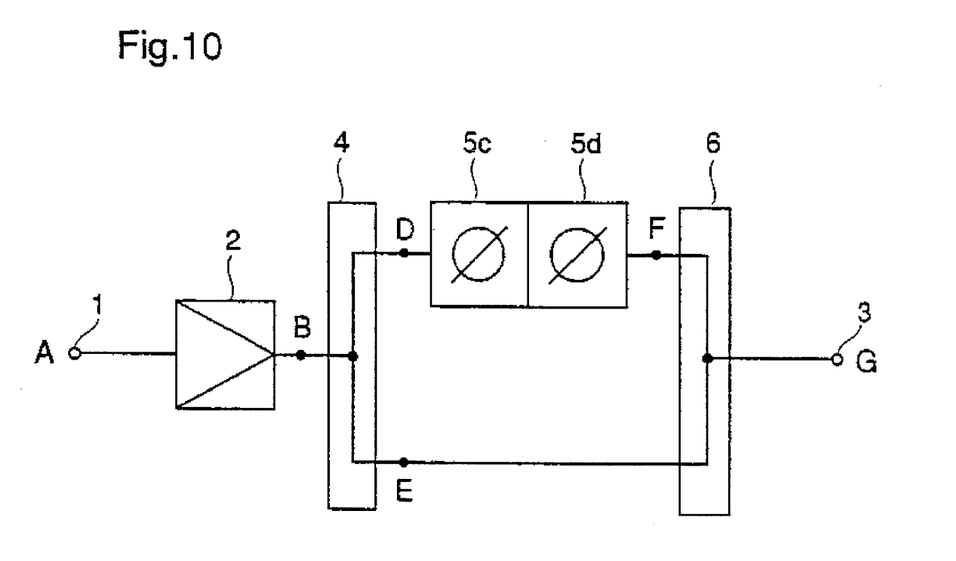
FIG. 10 is a diagram illustrating a circuit of a microwave amplifier circuit according to a sixth embodiment of the present invention.

FIG. 10 is a diagram showing a construction of a microwave amplifier circuit according to a sixth embodiment of the present invention. In this embodiment, another 90° phase shifter is connected at a rear stage of the second embodiment shown in FIG. 5 so as to output only the doublet component.

In FIG. 10, the same reference numerals as in FIGS. 5 and 9 designate the same or corresponding parts. Reference numerals 5c and 5d designate first and second 90° phase shifters.

A description is given of the operation. In FIG. 10, an input signal applied to the input terminal 1 is amplified by the amplifier 2, divided by the divider 4, and output to points D and E, respectively. When the signal applied to the amplifier is large, the signal is distorted depending on the characteristics of the amplifier as described above. As in the fifth embodiment, the signal that is output to the point D is input to the combiner 6 through the two 90° phase shifters 5c and 5d, while the signal that is output to the point E is input to the combiner 6 as it is, and both signals are combined and output to the output terminal 3. As a result, an output signal, including the doublet component, generated by the amplification is shifted in its phase for the fundamental wave by 180° (=90°+90°) and for the doublet by 360° (=180°+180°) by the phase shifters 5c and 5d and output to the combiner 6 from the point F. In the combiner, the signal from the point F and the signal from the point E are combined, and the fundamental wave components having been phase shifted by 180° are mutually canceled and the doublet components having been phase shifted by 360°, that is, having the same phase, are intensified and output to the output terminal 3.

In the microwave amplifier circuit of this sixth embodiment, by combining the signal that has passed through two 90° phase shifters connected in series and the signal that does not pass through the phase shifter, the doublet component that increases due to saturation of the amplified signal can be output to obtain the circuit functioning as a multiplier.

What is claimed is:

1. A microwave amplifier circuit comprising:

an input terminal for receiving an input signal and an output terminal;

a divider having an input and first and second outputs, the input being connected to the input terminal, the divider dividing the input signal into first and second divided signals and outputting the first and second divided signals to the first and second outputs, respectively;

first and second microwave amplifiers, each of the first and second microwave amplifiers having an input and an output, the inputs of the first and second microwave amplifiers being respectively connected to the first and second outputs of the divider;

a 90° phase shifter having an input and an output, the input of the 90° phase shifter being connected to the output of the first microwave amplifier; and a combiner having first and second inputs and an output, the first input of the combiner being connected to the output of the 90° phase shifter, the second input of the combiner being connected to the output of the second microwave amplifier, and the output of the combiner being connected to the output terminal, the combiner combining signals output by the 90° phase shifter and by the second microwave amplifier.

2. A microwave amplifier circuit comprising:

an input terminal for receiving an input signal and an output terminal;

a microwave amplifier having an input and an output, the input being connected to the input terminal;

a divider having an input and first and second outputs, the input of the divider being connected to the output of the microwave amplifier, the divider dividing a signal received at the input of the divider into first and second divided signals and outputting the first and second divided signals to the first and second outputs of the divider, respectively;

a 90° phase shifter having an input and an output, the input of the 90° phase shifter being connected to the first output of the divider; and a combiner having first and second inputs and an output, the first input of the combiner being connected to the output of the 90° phase shifter, the second input of the combiner being directly connected to the second output of the divider, and the output of the combiner being connected to the output terminal, the combiner combining signals output by the 90° phase shifter and by the divider at the second output of the divider.

3. A microwave amplifier circuit comprising:

an input terminal for receiving an input signal and an output terminal;

a divider having an input and first, second, and third outputs, the input being connected to the input terminal, the divider dividing the input signal into first, second, and third divided signals and outputting the divided signals to the first, second, and third outputs, respectively;

first, second, and third microwave amplifiers, each of the first, second, and third microwave amplifiers having an input and an output, the inputs of the first, second, and third microwave amplifiers being respectively connected to the first, second, and third outputs of the divider;

a −60° phase shifter having an input and an output, the input of the −60° phase shifter being connected to the output of the first microwave amplifier;

a +60° phase shifter having an input and an output, the input of the +60° phase shifter being connected to the output of the third microwave amplifier; and a combiner having first, second, and third inputs and an output, the first input of the combiner being connected to the output of the −60° phase shifter, the second input of the combiner being directly connected to the output of the second microwave amplifier, the third input of the combiner being connected to the output of the +60° phase shifter, and the output of the combiner being connected to the output terminal, the combiner combining signals output by the −60° phase shifter, the +60° phase shifter, and the second microwave amplifier.

4. A microwave amplifier circuit comprising:

an input terminal for receiving an input signal and an output terminal;

a microwave amplifier having an input and an output, the input being connected to the input terminal;

a divider having an input and first, second, and third outputs, the divider dividing the received signal into first, second, and third divided signals and outputting the first, second, and third divided signals to the first, second, and third outputs, respectively, the input of the divider being connected to the output terminal of the microwave amplifier;

a −60° phase shifter having an input and an output, the input of the −60° phase shifter being connected to the first output of the divider;

a +60° phase shifter having an input and an output, the input of the +60° phase shifter being connected to the third output of the divider; and a combiner having first, second, and third inputs and an output, the first input of the combiner being connected to the output of the −60° phase shifter, the second input of the combiner being directly connected to the second output of the divider, the third input of the combiner being connected to the output of the +60° phase shifter, and the output of the combiner being connected to the output terminal, the combiner combining signals output by the −60° phase shifter, the +60° phase shifter, and the divider at the second output of the divider.

5. A microwave amplifier circuit comprising:

an input terminal for receiving an input signal and an output terminal;

a divider having an input and first and second outputs, the input of the divider being connected to the input terminal, the divider dividing the input signal into first and second divided signals and outputting the first and second divided signals to the first and second outputs of the divider, respectively;

first and second microwave amplifiers, each of the first and second microwave amplifiers having an input and an output, the inputs of the first and second microwave amplifiers being respectively connected to the first and second outputs of the divider;

first and second 90° phase shifters connected in series, the serially connected first and second 90° phase shifters having an input and an output, the inputs being connected to the output of the first microwave amplifier; and a combiner having first and second inputs and an output, the first input of the combiner being connected to the output of the serially connected first and second 90° phase shifters, the second input of the combiner being directly connected to the output of the second microwave amplifier, and the output of the combiner being connected to the output terminal, the combiner combining signals output by the serially connected first and second 90° phase shifters and by the second microwave amplifier.

6. A microwave amplifier circuit comprising:

an input terminal for receiving an input signal and an output terminal;

a microwave amplifier having an input and an output, the input being connected to the input terminal;

a divider having an input and first and second outputs, the input being connected to the output of the microwave amplifier, the divider dividing a signal received at the input of the divider into first and second divided signals and outputting the first and second divided signals to the first and second outputs of the divider, respectively;

first and second 90° phase shifters connected in series, the serially connected 90° phase shifters having an input and an output, the input being connected to the first output of the divider; and a combiner having first and second inputs and an output, the first input of the combiner being connected to the output of the serially connected first and second 90° phase shifters, the second input of the combiner being directly connected to the second output of the divider, and the output of the combiner being connected to the output terminal, the combing combining the signals output by the serially connected first and second 90° phase shifters and by the divider at the second output.

* * * * *